(12) United States Patent
Jang et al.

(10) Patent No.: US 7,439,116 B2
(45) Date of Patent: Oct. 21, 2008

(54) APPARATUS AND METHOD FOR FORMING POLYCRYSTALLINE SILICON THIN FILM

(76) Inventors: Taek Yong Jang, 946-605 Buckjuckgol Lotte Apartment, Paldal-gu, Suwon-City, Gyeonggi-do (KR); Byoung Il Lee, A-402 Sion Villa, Geumgok-dong, Bundang-gu, Seongnam-City, Gyeonggi-do (KR); Young Ho Lee, 233-1303 Sungwon-Santevill 3rd Apartment, Sanghyeon-dong, Yongin-City, Gyeonggi-do (KR)

( * ) Notice: Subject to any disclaimer, the term of this patent is extended or adjusted under 35 U.S.C. 154(b) by 209 days.

(21) Appl. No.: 11/513,990

(22) Filed: Aug. 31, 2006

(65) Prior Publication Data
US 2007/0054499 A1 Mar. 8, 2007

(30) Foreign Application Priority Data
Sep. 6, 2005 (KR) ............ 10-2005-0082647
Dec. 16, 2005 (KR) ............ 10-2005-0124616
Apr. 13, 2006 (KR) ............ 10-2006-0033398

(51) Int. Cl.
*H01L 21/00* (2006.01)
(52) U.S. Cl. ............ 438/166; 438/486; 117/204; 118/722; 257/E21.316; 257/E21.572

(58) Field of Classification Search ................. 438/166, 438/479, 482, 486, 488, 489; 117/204; 118/722
See application file for complete search history.

(56) References Cited

U.S. PATENT DOCUMENTS 6,713,371 B1 * 3/2004 Gu .................. 438/488

* cited by examiner

Primary Examiner—Quoc D Hoang

(57) ABSTRACT

Apparatus and method for forming a polycrystalline silicon thin film by converting an amorphous silicon thin film into the polycrystalline silicon thin film using a metal are provided. The method includes: a metal nucleus adsorbing step of introducing a vapor phase metal compound into a process space where the glass substrate having the amorphous silicon formed thereon is disposed, to adsorb a metal nucleus contained in the metal compound into the amorphous silicon layer; a metal nucleus distribution region-forming step of forming a community region including a plurality of silicon particles every metal nucleus in a plane boundary region occupied by the metal compound by a self-limited mechanism due to the adsorption of the metal nucleus; and an excess gas removing step of purging and removing an excess gas which is not adsorbed in the metal nucleus distribution region-forming step.

18 Claims, 7 Drawing Sheets

APPARATUS AND METHOD FOR FORMING POLYCRYSTALLINE SILICON THIN FILM

BACKGROUND OF THE INVENTION

1. Field of the Invention

The present invention relates to apparatus and method for forming a polycrystalline silicon thin film from an amorphous silicon, using a metal.

2. Description of the Related Art

Polycrystalline silicon (hereinafter referred to as polysilicon) thin film employed in a technical field of the present invention is mainly used in a liquid crystal display (LCD), an organic electroluminescent (EL), or the like.

For example, since the LCD does not have a self-luminescent property unlike the cathode ray tube (CRT), it needs a backlight but is widely used as one of flat panel displays due to advantages, such as a low power consumption, a portable lightweight and slim profile and the like.

The LCD uses a color filter to display colors. A unit pixel of the color filter is comprised of R, G and B sub-pixels. The LCD employs a matrix control way to display colors through these respective pixels.

In such LCDs, an active matrix type LCD uses three transistors capable of processing R, G and B signals every pixel to obtain a definite color, and a thin film transistor (TFT) LCD is a representative of the active matrix type LCDS.

Owing to the aforementioned reasons, a process of manufacturing LCDs is included in the same category as a semiconductor device manufacturing process. For example, to form an indium tin oxide (ITO) thin film and an ITO electrode pattern on a surface of an LCD substrate, a photolithography technique is used like in the semiconductor device manufacturing process.

However, the LCD manufacturing process has a difference than the semiconductor device manufacturing process in that it uses a glass as a substrate instead of a wafer used in the semiconductor manufacturing process.

In more detail, a deposition of a silicon film on a substrate using a thermal decomposition of silane gas ($SiH_4$) requires a high temperature of approximately 600° C. However, when the glass substrate is exposed to a thermal environment for a long time, for example, to a temperature of 450-500° C., the glass substrate is deformed. Therefore, the deposition process of the semiconductor device manufacturing process cannot be directly applied to the LCD manufacturing process.

Thus, a plasma enhanced chemical vapor deposition (PECVD) is generally used in the LCD manufacturing process. Since the PECVD makes it possible to deposit a silicon thin film at a temperature within 350° C., it is possible to use the glass substrate.

However, the aforementioned PECVD has a limitation in that the silicon thin film formed is an amorphous silicon thin film. In the active matrix control way, each pixel is driven by an amorphous TFT, and a driving circuit is separately prepared by a circuit formed on a single crystalline silicon.

In other words, since the amorphous silicon has a low electron mobility, it cannot be used in a circuit operating at a high speed. In an LCD using an amorphous silicon TFT, it is necessary to electrically connect a PCB with an LCD panel using a tape carrier package (TCP) on which a driving IC is mounted.

The above-exemplified LCD increases a cost of the driving IC itself and its mounting cost. Also, a connection part between the TCP and the PCB and a connection part between the TCP and the LCD panel are weak to a mechanical and thermal impact and have a high contact resistance. Further, since an increase in resolution of the LCD panel requires a further decrease in pitch between pads for signal lines and scanning lines, it is difficult to perform a TCP bonding.

Resultantly, in view of trends toward a large-sized screen and a high picture quality of a flat panel display, the amorphous silicon TFT has a limitation in satisfying these requirements due to a low speed and a large volume.

So, a subject matter that must be solved is a conversion of the amorphous silicon to a crystal silicon, and is generally performed by a solid phase crystallization (SPC), an excimer laser crystallization (ELC), a metal-induced crystallization (MIC), a metal-induced lateral crystallization (MILC) and the like.

Among the above crystallization methods, the MIC and MILC methods are in the limelight in terms of productivity and large-sized screen. In the MIC and MILC methods, after a specific metal layer is deposited on or a specific metal is added to an amorphous silicon layer, the resultant amorphous silicon layer is thermally treated such that is crystallized even at a low temperature which does not damage the glass substrate.

The MIC method lowers the crystallization temperature of the amorphous silicon by contacting a specific kind of metal with the amorphous silicon. For example, Ni-induced crystallization is accelerated by $NiSi_2$ that serves as a crystallization nucleus and a last phase of a nickel silicide.

In real circumstance, NiSi2 has a similar structure to silicon and has a lattice constant of 5.406 Å which is similar to a lattice constant of silicon, 5.430 Å, and it serves as the crystallization nucleus for the amorphous silicon to accelerate the crystallization.

The crystallization of the amorphous silicon is accelerated by N2, H3, Ar, or H2 plasma since metal atoms are deposited on the amorphous silicon thin film by the $N_2$, $H_3$, Ar, or $H_2$ plasma to generate an MIC.

Herein, the MIC represents that a plurality of metal silicide nuclei are formed on a surface of the amorphous silicon thin film due to a high density of metal particles and thus the crystallization of the amorphous silicon proceeds to an inside of the amorphous silicon thin film. The MILC represents that the crystallization of the amorphous silicon proceeds to a lateral portion of the amorphous silicon thin film due to a low density of metal silicide nuclei.

Meanwhile, in order to distribute those metal nuclei (i.e., crystallization nuclei) on the amorphous silicon thin film, a sputtering is generally performed, in which a nickel panel serving as a target is disposed in a process space and a plasma is formed between the nickel panel and the substrate to adsorb nickel particles decomposed from the nickel target on the substrate.

However, in the distribution of the metal nuclei, the nickel target has a problem in that it is not suitable for a large-sized substrate.

In other words, in the sputtering, argon (Ar) gas is introduced into the process space and nickel particles are adsorbed on the substrate by an electromagnetic field. However, since the nickel is a ferromagnetic material, it is difficult to form a magnetic field in an inside of the process space.

To improve the above problem, a method in which a magnetic filed domain of the nickel target is arranged in a vertical direction to form a magnetic field has been publicly performed. However, the method has a difficulty in preparing the target of which one side is 300 mm long using the present technique level.

Also, it is difficult to distribute a proper metal catalyst for a polycrystallinelization, which is due to an error that a thin film should be formed by a sputtering to perform the MILC process.

That is, the polycrystallinelization can be sufficiently performed by not forming a thin film but by distributing a crystallization nucleus, and a lateral induction is performed from the crystallization nucleus, so that the amorphous silicon is crystallized into the polycrystalline silicon.

At this time, the crystallization nuclei, i.e., metal particles (elements) can be needed to be uniformly distributed on an entire region of the glass substrate. The sputtering for forming a thin film on an entire surface of the glass substrate for this purpose is an excessive process and apparatus in terms of the MILC process for the distribution of the crystallization nuclei. The metal catalyst provided by the sputtering acts as an impurity in the silicon thin film to degrade the property of the crystallized silicon thin film.

In the polycrystalline thin film transistor by the MIC or MILC, it is confirmed that a large amount of metal diffused into the channel region is distributed to cause a serious metal contamination.

In other words, the contamination due to the metal impurity in the channel region has a large influence on the generation of a leakage current to deteriorate the field effect mobility and the threshold voltage characteristic and thus deteriorate the electrical property of the polysilicon thin film transistor.

In the long run, under a circumstance that a high temperature heat treatment is impossible due to the physical property of the glass substrate and a low temperature heat treatment must be inevitably performed, the forming of a metal catalyst layer for performing the low temperature heat treatment is inevitable. However, by doing so, researchers face a dilemma that the supplied catalyst metal acts as a contamination material.

To improve the above drawback, there was a trial in which a separate region surrounding the channel region is formed by an offset to prevent metal material from being penetrated into the channel region (Korean Patent Application No. 10-1998-0003781 entitled "Method of manufacturing thin film transistor".

However, to dispose the offset region, it is necessary to add a process of separately forming an offset pattern. A decrease in the productivity due to the additional forming of the offset pattern is inevitable, and thus a method that can more basically solve such a problem is required.

Meanwhile, it is a more important and basic problem that it is difficult to adjust the grain size in a preferred size range on the polysilicon thin film. This means that the distribution concentration of metal particles as a catalyst for the adjustment of grain size cannot be adjusted by the sputtering or other thin film forming.

In more detail, FIG. 1 is a concept view showing the size of a lower grain occupied by a gate electrode (channel region) of a TFT having a polysilicon thin film formed by an MLIC. Referring to FIG. 1, the crystallization of the polysilicon is progressed centering on a crystallization nucleus, and a grain boundary is generated at an overlapping portion in a crystallization progress direction performed centering on different nuclei.

At this time, the channel region has a size artificially determined by a design rule. The smaller the grain size is, the more the number of the grain boundary is, and the larger the grain size is, the less the number of the grain boundary is.

Meanwhile, as aforementioned, the polysilicon thin film is used as a semiconductor layer for a TFT that is a pixel driving element of an LCD or an organic EL device. If the properties of the TFTs constituting the respective pixels are different, non-uniform picture quality is caused. Therefore, it is an important factor to maintain the uniformity in picture quality.

Then, when a bond between silicon atoms is not perfect, charge carriers (i.e., electrons/holes) are trapped in the grain boundary to form a potential barrier, which hinders movement of the carriers to deteriorate the characteristic of the TFT.

That is, the potential barrier causes a decrease of the mobility, an increase of $V_{th}$ or an increase of the leakage current, and the characteristic of the TFT is varied depending on the number and position of the grain boundaries existing in the channel region.

For example, when the grain size is large with respect to the channel region having the same volume and thus the number of the grain boundaries is small, shown in FIG. 1A, the characteristic of the TFT for each channel region is enhanced.

Then, the left channel region has two grain boundaries, whereas the right channel region has five grain boundaries. Thus, a large difference in the number of the grain boundaries in the channel regions of the same layer deteriorates the uniformity wholly.

Meanwhile, when the size of the grains in the channel regions is small and thus the number of the grain boundaries existing in each channel region is proper as shown in FIG. 1b, the characteristic of the TFT for each channel region may be lowered, but the whole uniformity can be secured, which is most preferred in view of the whole characteristic of the TFT.

It is an optimal condition that the channel region has a maximum grain size under a condition that the uniformity is secured. However, the case shown in FIG. 1C secures the uniformity due to a very small grain size, but does not meet the characteristic requirements of the TFT.

In the long run, it is required to properly dispose the grain boundaries in a channel region so as to maintain the uniformity of the channel region. Therefore, it is required to provide a polysilicon thin film having a proper-sized grain boundary for a channel region determined in a designing step.

Under these circumstances, the aforementioned sputtering allows a metal silicide to be formed with an excessive concentration. Therefore, it is extremely natural that the sputtering fails to adjust the grain boundary. In the related art MLIC, the addition of the crystallization nucleus allows a metal layer to be formed rather than allows the crystallization nucleus to be distributed into the amorphous silicon layer, so that it fails to provide means for forming a crystallization nucleus that can adjust the distribution concentration.

SUMMARY OF THE INVENTION

Accordingly, the present invention is directed to a liquid crystal display device that substantially obviates one or more of the problems due to limitations and disadvantages of the related art.

An object of the present invention is to provide a method for forming a polycrystalline silicon thin film in which a metal layer having a distribution of metal particles suitable for forming a crystallization nucleus in an amorphous silicon layer, thus capable of increasing the crystallizing rate of an amorphous silicon, decreasing the crystallizing temperature of the amorphous silicon, and substantially decreasing a contamination due to the metal particles.

An object of the present invention is to provide a method for forming a polycrystalline silicon thin film in which metal nuclei are distributed at a low concentration, an ambient for suppressing a reaction of forming a metal silicide is prepared, a metal silicide having a extremely low concentration is formed on an amorphous silicon layer to enable the adjustment of the grain size, thus controlling the distribution concentration of the crystallization nuclei.

A further object of the present invention is to provide a method for forming a polycrystalline silicon thin film in which one cycle that metal nuclei can be distributed at a low concentration is performed, or the one cycle is divided into two or more cycles for a finer adjustment of the crystallization nuclei distribution.

Still another object of the present invention is to provide an apparatus for forming a polycrystalline silicon thin film.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a backlight unit including: a plurality of LED (light emitting diode) chips; a lightguide plate for converting light generated from the LED chips into surface light; and a plurality of optical guide module corresponding to the respective LED chips and disposed between the LED chips and the lightguide plate.

In another aspect of the present invention, there is provided a backlight unit including: a lightguide plate; a plurality of LED chips disposed at a light incident area of the lightguide plate; and an optical guide module integrally coupled to the light incident area of the lightguide plate.

In still another embodiment of the present invention, there is provided a liquid crystal display including: a display panel; a plurality of LED (light emitting diode) chips; a lightguide plate for converting light generated from the LED chips into surface light; and a plurality of optical guide module corresponding to the respective LED chips and disposed between the LED chips and the lightguide plate.

In still yet another aspect of the present invention, there is provided a liquid crystal display including: a display panel; a lightguide plate; a plurality of LED chips disposed at a light incident area of the lightguide plate; and an optical guide module integrally coupled to the light incident area of the lightguide plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

The present invention will now be described more fully with reference to the accompanying drawings, in which exemplary embodiments of the invention are shown.

Figure 1A:
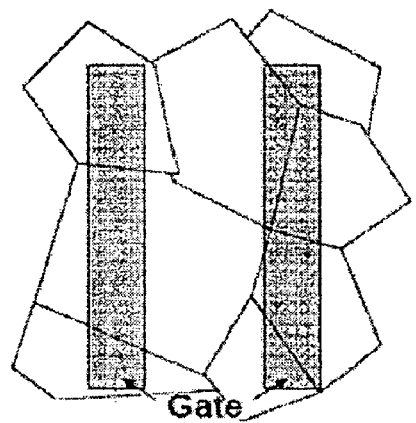
FIGS. 1A to 1C are concept views showing a grain formed in a channel region of a polysilicon thin film.
Figure 1B:
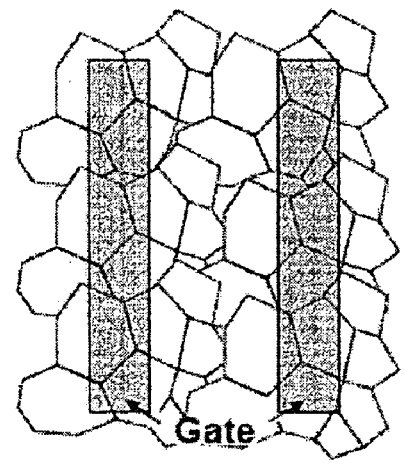
Figure 1C:
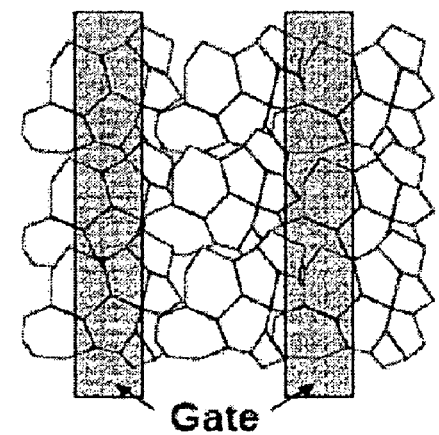
Figure 2A:
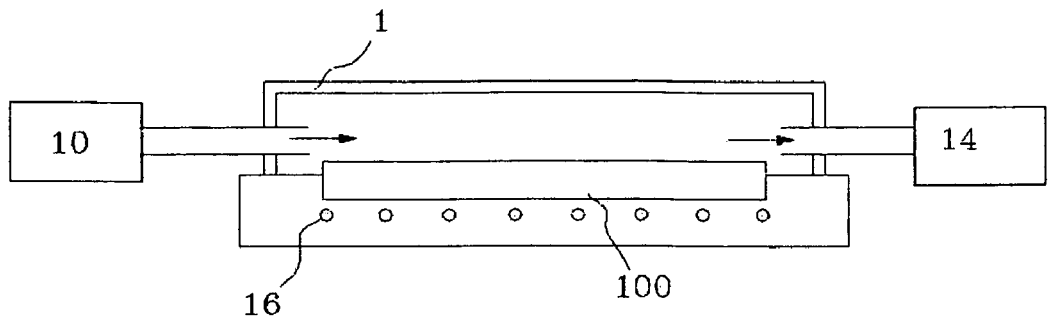
FIGS. 2A to 2C are concept views of atomic layer deposition (ALD) apparatuses designed to distribute a metal nucleus (Ni nucleus) as a catalyst on a glass substrate according to the present invention.
Figure 2B:
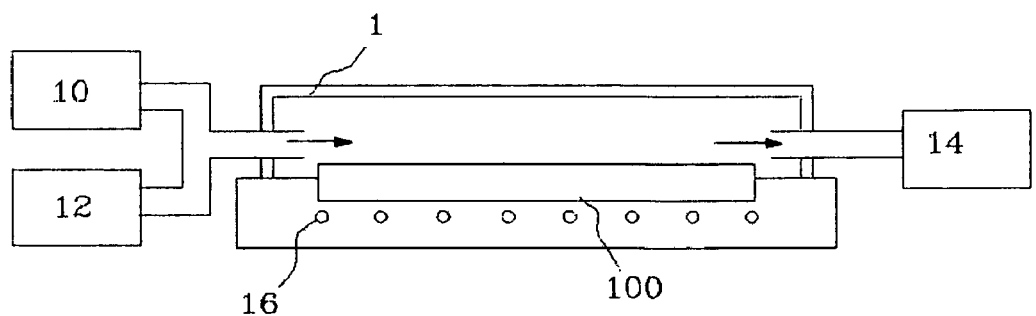
Figure 2C:
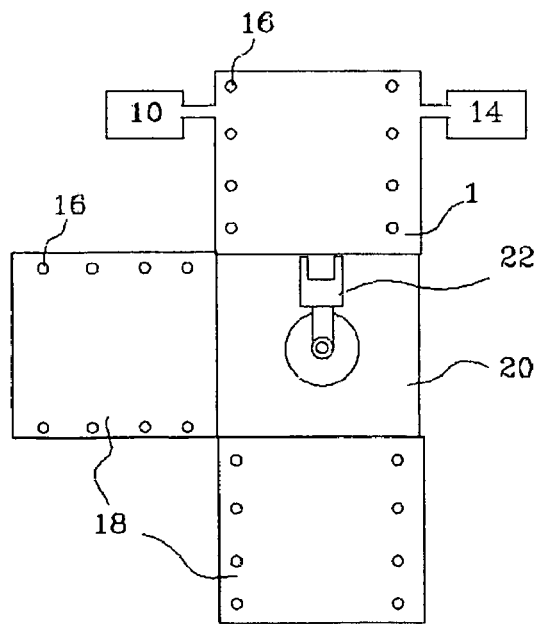
Figure 3:
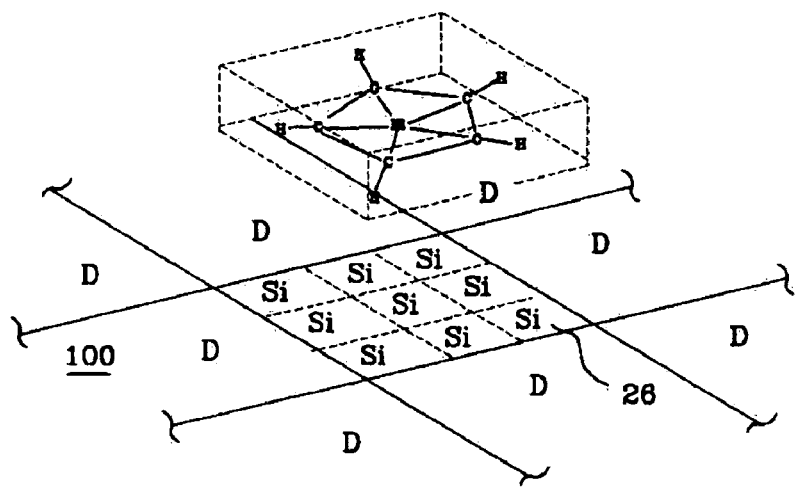
FIG. 3 is a concept view showing that nickel molecules having a preoccupied region are adsorbed by $Ni(C_5H_5)_2$ on an amorphous silicon.
Figure 4:
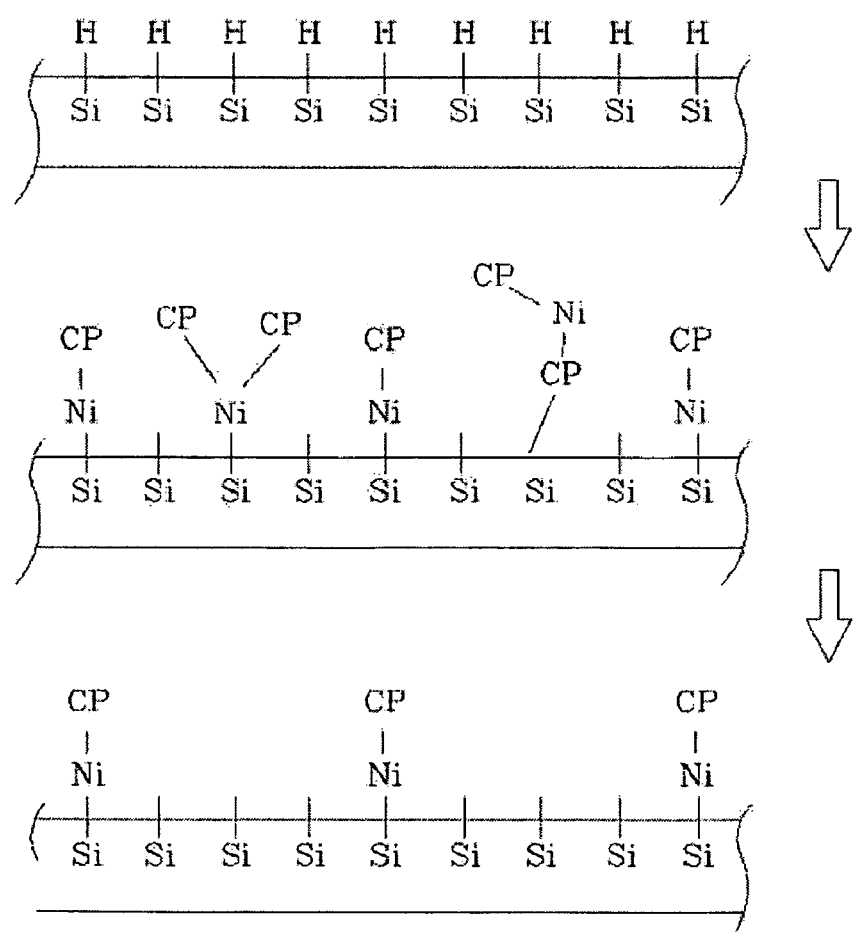
FIG. 4 is a side concept view illustrating steps that nickel nucleus as a metal nucleus according to the present invention is created.
Figure 5A:
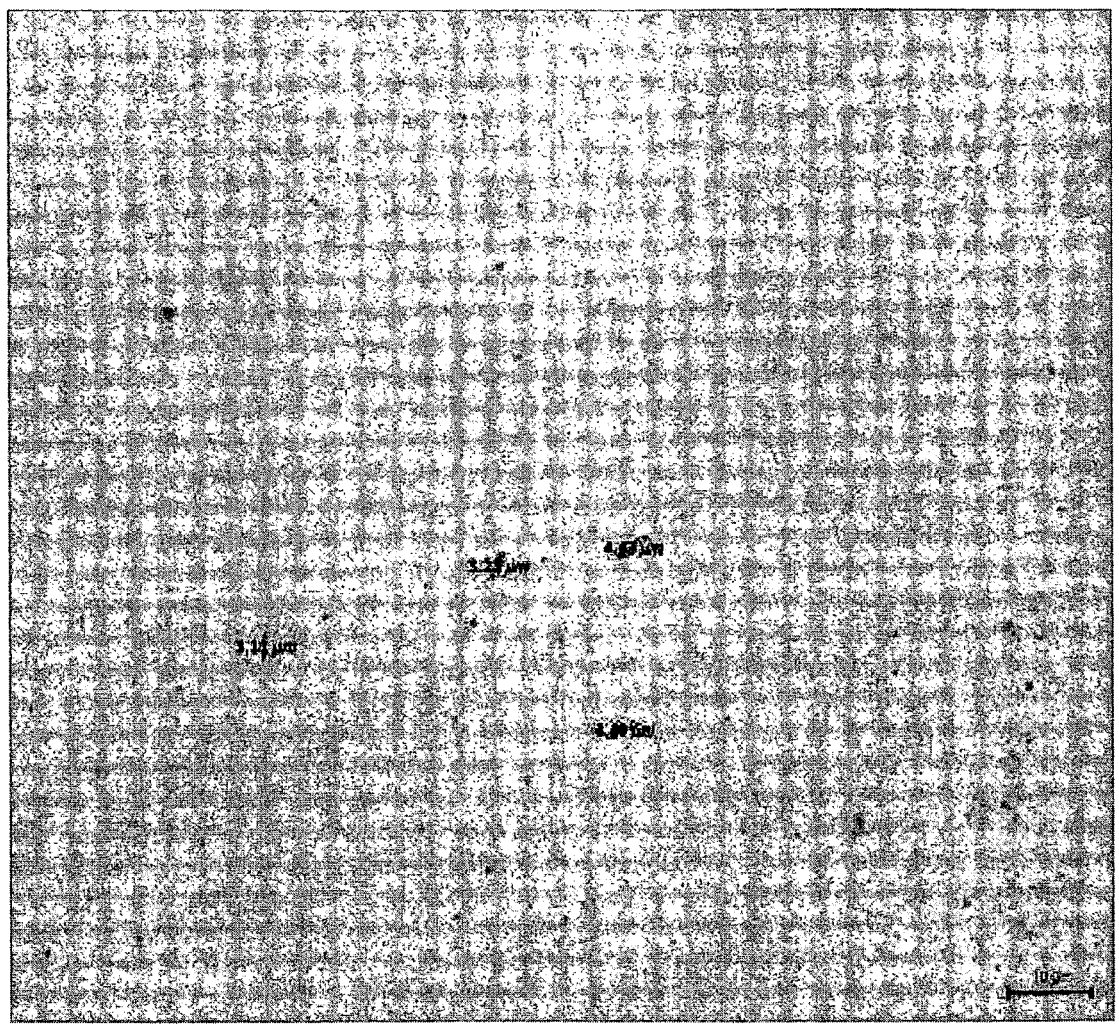
FIGS. 5A to 5C are magnified photographs of polysilicon thin films illustrating that the grain size of the polysilicon thin films is adjusted according to an adjustment of distribution density of metal nuclei.
Figure 5B:
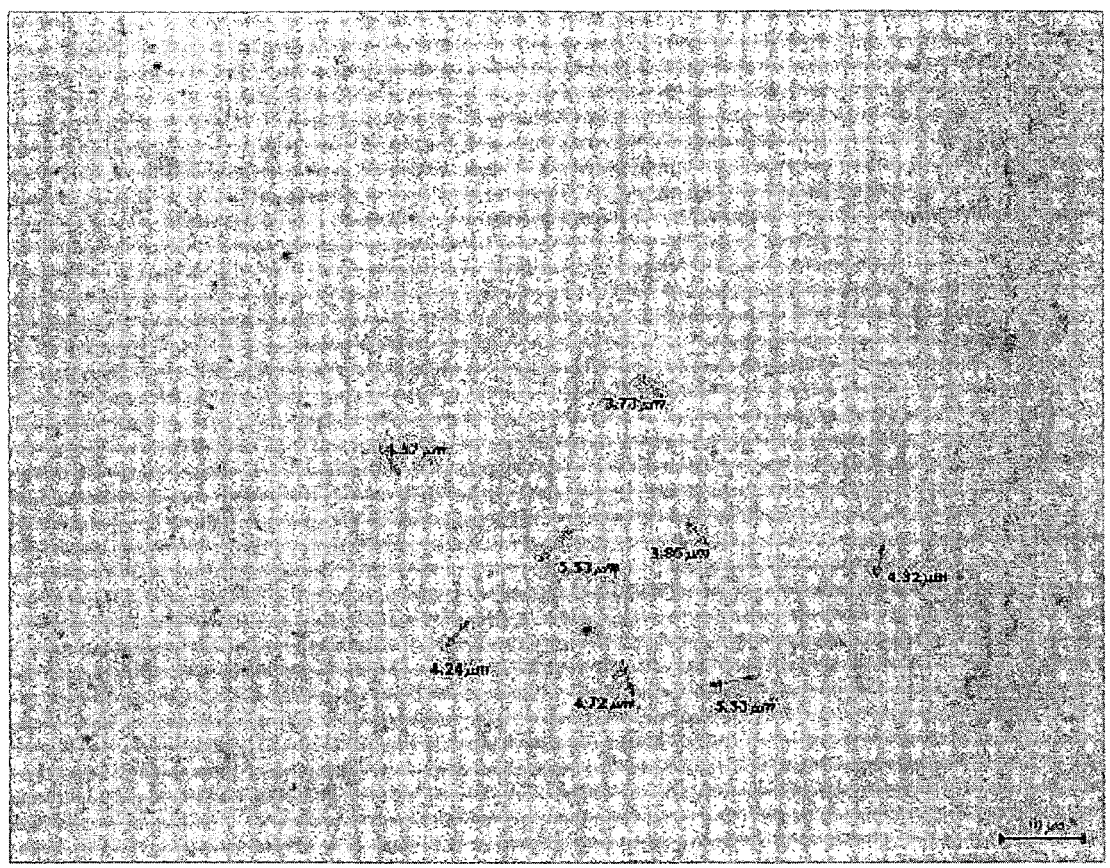
Figure 5C:
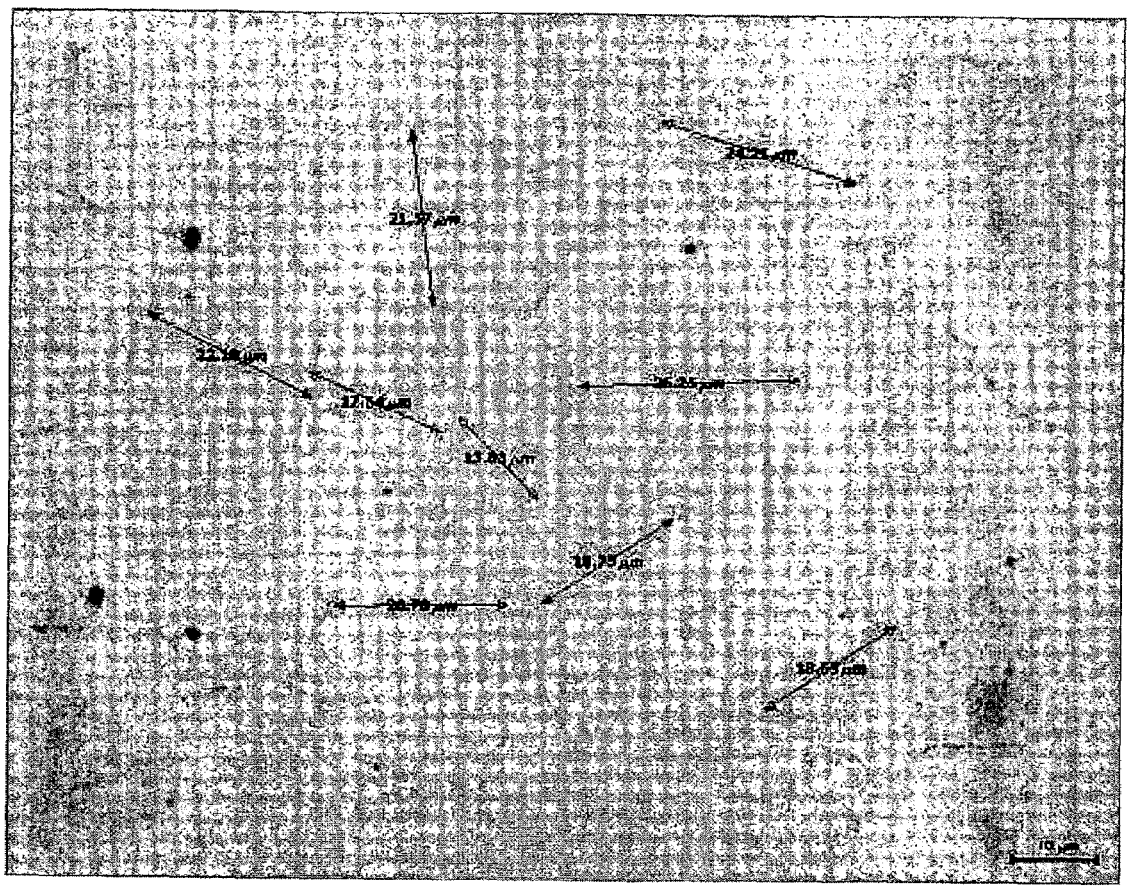

FIGS. 2A to 2C are concept views of atomic layer deposition (ALD) apparatuses designed to distribute a metal nucleus (Ni nucleus) as a catalyst on a glass substrate according to the present invention, FIG. 3 is a concept view showing that nickel molecules having a preoccupied region are adsorbed by $Ni(C_5H_5)_2$ on an amorphous silicon, FIG. 4 is a side concept view illustrating steps that nickel nucleus as a metal nucleus according to the present invention is created, and FIGS. 5A to 5C are magnified photographs of polysilicon thin films illustrating that the grain size of the polysilicon thin films is adjusted according to an adjustment of distribution density of metal nuclei.

Figure 6:
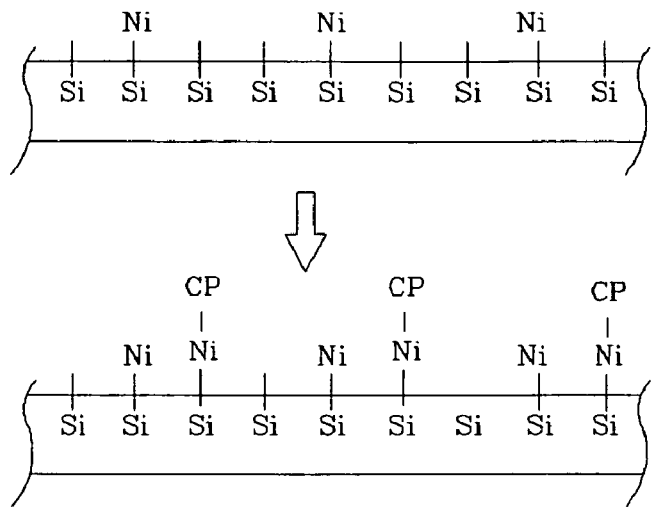
FIG. 6 is a side concept view illustrating a step of adjusting a distribution density according to the present invention.
Figure 7:
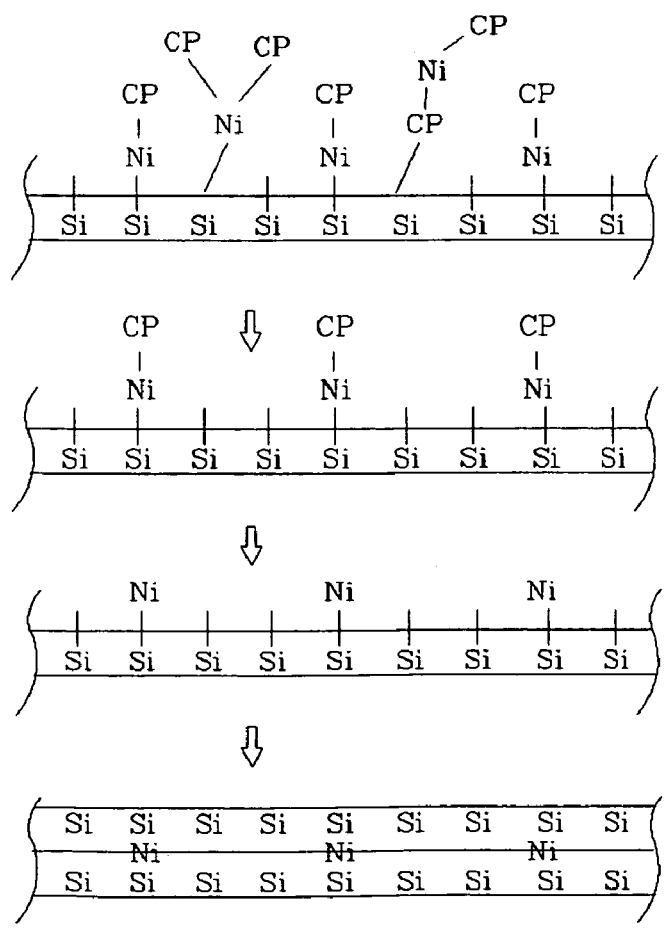
FIG. 7 is a process diagram showing that metal catalysts are distributed between amorphous silicon thin films according to another embodiment of the present invention.

Also, FIG. 6 is a side concept view illustrating a step of adjusting a distribution density according to the present invention and FIG. 7 is a process diagram showing that metal catalysts are distributed between amorphous silicon thin films according to another embodiment of the present invention.

The present invention provide a method for forming a polycrystalline silicon thin film by including depositing an amorphous silicon layer on a glass substrate and forming a metal layer on the amorphous silicon layer to crystallize the amorphous silicon layer, the method being characterized by including:

a metal nucleus adsorbing step of introducing a vapor phase metal compound into a process space where the glass substrate having the amorphous silicon formed thereon is disposed, to adsorb a metal nucleus contained in the metal compound into the amorphous silicon layer;

a metal nucleus distribution region-forming step of forming a community region including a plurality of silicon particles every metal nucleus in a plane boundary region occupied by the metal compound by a self-limited mechanism due to the adsorption of the metal nucleus; and an excess gas-removing step of purging and removing an excess gas which is not adsorbed in the metal nucleus distribution region-forming step.

At this time, the above method may include a metal layer forming step of heating the glass substrate to a thermal decomposition temperature in a state that the metal molecules are disposed, to thermally decompose radicals other than the metal element chemically adsorbed onto the amorphous silicon, or introducing a reaction gas into the process space to react the amorphous silicon with the radicals other than the metal element chemically adsorbed onto the amorphous silicon, purging and removing the non-reacted radicals to obtain only the metal element from the metal distribution region and obtain a metal layer (metal nucleus) having a low concentration and uniform distribution.

In particular, the metal layer forming step may, after removing the excess gas in the excess gas removing step, further include a metal nucleus disposition density adjusting step of thermally treating and oxidizing the metal nucleus in an oxygen ambient to randomly suppress a metal-silicide nucleus formation for a metal-induced crystallization and performing a metal-induced crystallization process.

Separately from the above embodiment, the metal layer forming step may, after removing the excess gas in the excess gas removing step, further include a distribution density adjusting step of reacting the amorphous silicon layer with radicals other than the adsorbed metal nucleus by a thermal decomposition or by introducing a reaction gas, purging and removing the remaining radicals to release the community region, again adsorbing the metal compound between the occupied metal nuclei to adjust the distribution density of the metal nuclei.

From the metal nucleus disposition density-adjusting step, it is possible to adjust the grain size. In particular, by a combination of the metal nucleus disposition density-adjusting step and the distribution density-adjusting step, the metal nucleus disposition density is adjusted to dispose a metal nucleus having an extremely low concentration, and on the basis of this, the distribution density-adjusting step is again performed to obtain a desired distribution density of the metal nucleus.

In addition, the obtained metal layer (metal nucleus) may experience a metal-induced crystallization in the same process space. Accordingly, the method of the present invention is characterized by, after removing the excess gas in the excess gas-removing step, further comprising a polycrystallinelization-processing step of performing a thermal treatment for a crystallization in a reaction chamber that is the same process space.

A metal constituting the vapor phase metal compound may be any one selected from the group consisting of Ni, Al, Ti, Ag, Au, Co, Sb, Pd, Cu, or a combination thereof. More preferably, the metal is Ni and its source gas is $Ni(Cp)_2$.

The metal layer formed in the metal nucleus distribution region-forming step is performed by an ALD (atomic layer deposition). At this time, the excess gas removing step includes reacting the amorphous silicon layer with radicals other than the adsorbed metal nucleus by a thermal decomposition or by introducing a reaction gas, and purging and removing the remaining radicals such that the metal nuclei are distributed at a single atomic layer thickness or less by the ALD of one cycle.

The metal nucleus-adsorbing step is performed in a temperature environment having a temperature range of 100-300° C. The vapor phase metal compound is supplied with a pressure of 0.1 Torr to 300 Torr.

The oxygen ambient of the metal nucleus disposition density-adjusting step is formed by introducing $O_2$ gas, $H_2O$ gas, $N_2O$ gas or $O_3$ gas into the process space.

At this time, the oxygen ambient is formed by introducing oxygen compound into the process space in a plasma state.

In order to provide the reaction chamber that is the process space with the oxygen ambient, the pressure of the reaction chamber can be reduced to a pressure less than the atmospheric pressure.

Meanwhile, the thermal treatment in the metal nucleus disposition density-adjusting step is performed in a temperature range of from a metal nucleus adsorbing process temperature to a crystallization heat treatment temperature.

The heat treatment in the metal nucleus disposition density-adjusting step is included in a temperature elevation process for performing a metal-induced crystallization.

The metal nucleus disposition density-adjusting step further includes a grain size-adjusting step of adjusting the grain size depending on the temperature of the heat treatment and an exposure time.

After the metal nuclei are disposed according to the method of the present invention, another amorphous silicon layer is formed on the previously formed amorphous silicon layer and the metal nuclei so that the metal nuclei are disposed and fixed between the amorphous silicon layers.

The above method may, after removing the excess gas in the excess gas removing step, further include:

a metal nucleus disposing step of reacting the amorphous silicon layer with radicals other than the adsorbed metal nucleus by a thermal decomposition or by introducing a reaction gas, and purging and removing the remaining radicals to dispose only the metal nucleus; and a metal catalyst-containing amorphous silicon layer-forming step of forming an amorphous silicon layer having a remainder thickness on a distribution of the metal nuclei disposed on the amorphous silicon layer formed at a predetermined thickness in the metal nucleus-disposing step.

Meanwhile, the present invention also provides an apparatus for forming the polycrystalline silicon thin film.

The apparatus can be classified into two types: 1) apparatus for deposition of amorphous silicon layer and disposition of metal nuclei; and 2) apparatus further including a heat treatment unit in addition to the functions of 1).

That is, the ALD technique employed in the present invention enables to perform a deposition of an amorphous silicon layer and an in-situ disposition of metal nuclei in one reaction space unlike the related art sputtering apparatus.

In concrete, as shown in FIG. 2B, inn an apparatus for forming a polycrystalline silicon thin film including an amorphous silicon deposition apparatus having a first reaction chamber that is a process space, for depositing an amorphous silicon layer on a glass substrate is installed, and a metal nucleus deposition apparatus having a second reaction chamber that is a separate process space from the deposition apparatus, for depositing a metal nucleus on the glass substrate having the amorphous silicon layer formed thereon, the apparatus for forming a polycrystalline silicon thin film comprising:

a source gas supply unit 10 for supplying a vapor phase metal compound for an adsorption of a metal nucleus into a reaction chamber providing a process space, together with a deposition gas supplying unit 12 for deposition of an amorphous silicon layer;

a gas exhaust unit 14 for exhausting the reacted deposition gas and an excess gas; and a heating unit 16 disposed in the reaction chamber 1 to provide the reaction chamber with a thermal decomposition temperature environment for the deposition of the amorphous silicon layer and a thermal treatment environment for adsorption of the metal nucleus, wherein the reaction chamber 1 is included in the apparatus for forming a polycrystalline silicon thin film, as an in-situ process reaction chamber for performing a step of depositing the amorphous silicon layer and an in-situ step of adsorbing the metal nucleus in a same process space using the source gas supply unit 10, the gas exhaust unit 14 and the heating unit 16.

Also, the ALD technique employed in the present invention enables to perform a disposition of metal nuclei and an in-situ metal-induced crystallization of the metal nuclei in one reaction space unlike the related art sputtering apparatus.

In concrete, referring to FIGS. 2A and 2B, in an apparatus for forming a polycrystalline silicon thin film including a metal nucleus deposition apparatus having a first reaction chamber that is a process space, for depositing a metal nucleus on a glass substrate having an amorphous silicon layer formed thereon, and a crystallization process apparatus having a second reaction chamber that is a separate process space from the metal nucleus deposition apparatus, for thermally treating the glass substrate with the metal nucleus to perform a crystallization of the amorphous silicon layer, the apparatus for forming a polycrystalline silicon thin film includes:

a source gas supply unit 10 for supplying a vapor phase metal compound for an adsorption of a metal nucleus into a reaction chamber providing a process space;

a gas exhaust unit 14 for exhausting an excess gas; and a heating unit 16 disposed in the reaction chamber 1 to provide the reaction chamber with a thermal decomposition temperature environment for the adsorption of the metal nucleus and a thermal treatment environment for crystallization of the amorphous silicon layer, wherein the reaction chamber 1 is included in the apparatus for forming a polycrystalline silicon thin film, as an in-situ process reaction chamber for performing a step of adsorbing the metal nucleus on the glass substrate and an in-situ thermal treatment step in a same process space using the source gas supply unit 10, the gas exhaust unit 14 and the heating unit 16.

The above apparatus can be implemented by a rapid thermal process (RTP), and the employment of the ALD allows the reaction chamber to be commonly used for the same process.

Meanwhile, the present invention can be applied to an apparatus having a plurality of reaction spaces by a combination of the elements of the aforementioned apparatuses. For example, as shown in FIG. 2C, there is provided an apparatus for forming a polycrystalline silicon thin film having two or more crystallization process reaction chambers and one distribution process reaction chamber.

When comparing the distribution process of metal catalyst with the thermal treatment process for crystallization, since the thermal treatment process takes a time, the apparatus of FIG. 2C is used to properly adjust an overall process time. This apparatus does not use the RTP.

That is, in an apparatus for forming a polycrystalline silicon thin film including a metal nucleus deposition apparatus having a first reaction chamber that is a process space, for depositing a metal nucleus on a glass substrate having an amorphous silicon layer formed thereon, and a crystallization process apparatus having a second reaction chamber that is a separate process space from the metal nucleus deposition apparatus, for thermally treating the glass substrate with the metal nucleus to perform a crystallization of the amorphous silicon layer, the apparatus for forming a polycrystalline silicon thin film includes:

a source gas supply unit 10 for supplying a vapor phase metal compound for an adsorption of a metal nucleus into a distribution process reaction chamber providing a process space;

a gas exhaust unit 14 for exhausting an excess gas;

a heating unit 16 provided for an adsorption of a metal nucleus;

a crystallization process reaction chamber 18 separately disposed from the distribution process reaction chamber 1 and provided with the heating unit 16;

wherein the crystallization process reaction chamber 18 is connected with the distribution process reaction chamber through a loadlock room 20 having an end effector 22 for loading/unloading the glass substrate such that the glass substrate 100 transferred from the distribution process reaction chamber 1 is thermally treated.

As aforementioned, to form a crystallization nucleus in the amorphous silicon layer, there is provided a method for forming a polycrystalline silicon thin film in which a proper (i.e., controllable) distribution of metal particles is maintained.

Under an inevitable condition that the metal particles act as a contamination material of the channel region, it is the most basic subject matter to form a metal catalyst layer which maintains the metal particles for forming the crystallization nuclei in a proper distribution.

When a metal catalyst layer having a low and uniform concentration distribution of metal particles is formed on the glass substrate, the channel region can be prevented from being contaminated due to the metal particles, like the crystallization nucleus by the MIC and MILC.

Also, in order to control the grain size, it is required to basically perform a process of distributing metal nuclei having a maximum grain size, i.e., an extremely low concentration. By doing so, it is possible to control the grain size.

Thus, the present invention fixes the community region of a plurality of amorphous silicon particles at a region occupied by metal molecules using the size of the metal molecules while depositing the metal particles on the glass substrate.

Also, the present invention provides a method capable of coping with a large-sized screen which cannot be obtained by an adsorption method, for example, the sputtering using Ni.

Further, the present invention provides an apparatus for forming a polycrystalline silicon thin film that can perform a process of distributing metal nuclei on the amorphous silicon formed on the glass substrate, and an in-situ crystallization process of thermally treating the amorphous silicon to crystallize the amorphous silicon.

This concept starts from a basic reason why a metal layer having a thickness is not formed on the amorphous silicon layer but Ni nuclei (particles) are distributed as crystallization nuclei on the amorphous silicon layer.

Therefore, the present invention does not set importance on and deviates from the sputtering for forming a thin film, thus successively performing the distribution process of the metal nuclei and the crystallization process of the amorphous silicon layer in the same process space.

Again reviewing the related art drawbacks, they are due to an erroneous concept that a metal thin film should be essentially formed on the amorphous silicon layer so as to crystallize the amorphous silicon layer.

The crystallization of the amorphous silicon layer is sufficient not by forming a metal thin film but simply by distributing crystallization nuclei. From these crystallization nuclei, the crystallization of the amorphous silicon layer is progressed, so that the amorphous silicon layer is crystallized into the polycrystalline silicon layer.

At this time, it is required to uniformly distribute the crystallization nuclei, i.e., metal particles (elements) on an entire area of the glass substrate. For this purpose, the use of the sputtering for forming a metal thin film on an entire area of the glass substrate is an excessive process and apparatus, upon considering only the need of the distribution of the crystallization nuclei.

Accordingly, the present invention uses a surface reaction of an ALD process so as to uniformly distribute those crystallization nuclei on a large-sized glass substrate.

That is, deposition of metal particles for the creation (distribution) of metal nuclei is performed by adsorption and diffusion of atoms on the glass substrate.

The metal nuclei adsorbed on the glass substrate form a preoccupied region of the glass substrate, and their growth is performed by a direct reaction with a reaction gas and a surface diffusion through an exposed portion of the surface according to the respective atom editions.

During this growth process, the edition of atom is progressed to form a fine crystal at a portion having the lowest free energy, such as kink. The ALD apparatus has the reaction chamber, the reaction gas supply unit and the reaction gas exhaust unit, and the crystallizing apparatus also has the reaction chamber, the process gas supply unit and the process gas exhaust unit. Thus, since the ALD apparatus and the crystallizing apparatus have the common elements, it is possible to provide a single apparatus capable of performing the distribution process of metal nuclei and the crystallization process.

Also, the deposition of the amorphous silicon layer and the distribution process of the metal nuclei can be performed in the same process.

Hereinafter, the present invention will be described with an embodiment in which a Ni metal layer is formed on an amorphous silicon layer. First, an atomic layer deposition (ALD) apparatus shown in FIG. 2A is used to form the Ni metal layer according to the present invention.

A reaction chamber 1 forming a process space is provided. A source gas supply unit 10 for supplying a source gas for adsorbing metal molecules and a reaction gas for thermally decomposing the adsorbed metal molecules and allowing a reaction to take place is connected the reaction chamber 1.

The source gas supply unit 10 includes a purge gas supply unit (not shown) for removing an excess gas which is not adsorbed on a glass substrate 100, and a reaction gas supply unit (not shown) for supplying a reaction gas which reacts with other radicals other than Ni atoms in the adsorbed metal compound to remove those radicals.

These supply units and the reaction chamber 1 are connected by a supply tube, and a high speed valve (not shown) is installed on the supply tube so as to adsorb a fine thin film.

A gas exhaust unit 14 for exhausting the excess gas or the reaction gas is also connected with the reaction chamber 1.

The reaction chamber 1 is provided with a heating unit 16 for a thermal decomposition of the glass substrate 100, and an elevator unit (not shown) for loading/unloading the glass substrate 100 into an inside of the reaction chamber 1.

The reaction chamber 1 is also provided with a reactive gas generator for filtering a reduction material and making a plasma environment.

However, the present invention is not necessarily limited to these apparatuses. For example, when a carrier gas is used, each gas supply unit may be changed. While the figures of the present invention show a single wafer type processing apparatus for processing one sheet of glass substrate, it can be applied to a batch type processing apparatus. In that case, the structures of the heating unit or the boat may be changed.

As the metal catalyst is deposited on the glass substrate 100, an in-situ process space with other process can be provided.

In other words, the process for the distribution of the metal nuclei according to the present invention is generally included in a chemical vapor deposition (CVD), and the process of forming the amorphous silicon layer in a thermal decomposition environment of silicon is also included in the CVD.

Accordingly, the process of forming the amorphous silicon and the process of distributing the metal nuclei can be performed in the same process space in-situ. In the present invention, like in the above embodiment, some of the amorphous silicon layer, for example, half of the amorphous silicon layer is formed, metal nuclei are distributed thereon as a catalyst, and half of the amorphous silicon layer is also formed thereon. Also, the apparatus for the above processes can be provided.

That is, as shown in FIG. 2B, a reaction chamber 1 forming a process space is provided. A deposition gas supply unit 12 for depositing an amorphous silicon layer, a source gas supply unit 10 for supplying a vapor phase metal compound for adsorbing metal nuclei, a gas exhaust unit 14 for exhausting the reacted deposition gas and the excess source gas are respectively connected with the reaction chamber 1. The reaction chamber 1 is also provided with a heating unit 16 providing a thermal decomposition temperature environment for a deposition of the amorphous silicon layer and an adsorption of metal nuclei. The reaction chamber 1 serves as a successive process reaction chamber for successively performing the deposition process of the amorphous silicon layer and the adsorption process of the metal nuclei in the same process space, together with the deposition gas supply unit 12, the source gas supply unit 10, the commonly used exhaust unit 14 and the heating unit.

In the present invention, for example, a process in which Ni metal nuclei are distributed on the amorphous silicon layer will be described.

FIG. 3 is a concept view showing that nickel molecules having a preoccupied region on the amorphous silicon layer are adsorbed by Ni(Cp)2, for example, $Ni(C_5H_5)_2$, and FIG. 4 is a side concept view illustrating steps that nickel nucleus as a metal nucleus according to the present invention is created.

After the reaction chamber 1 is heated in a temperature range of 130-300° C. by the heating unit 16, metal source gas, for example, Ni(Cp)2 is introduced into the reaction chamber 1 and is then adsorbed onto the glass substrate, specifically, onto the amorphous silicon layer (see FIGS. 3 and 4).

At this time, Ni molecular layers of more than one layer are chemically adsorbed by a self-limited mechanism, and a purge gas is introduced into the reaction chamber 1 to exhaust an excess gas which is not chemically adsorbed.

Herein, the excess gas includes Ni molecules physically adsorbed on the glass substrate, and is removed by the purge gas, so that uniform Ni molecules are distributed on the amorphous silicon layer (i.e., glass substrate 100) by the self-limited mechanism.

At this time, one Ni molecule is disposed on the amorphous silicon layer with an area occupied by its size.

Therefore, one Ni molecule disposed on the amorphous silicon layer includes a plurality of amorphous silicon particles 26 on a plane region 'D'.

That is, by the area of the one Ni molecule chemically adsorbed by the self-limited mechanism, the community region 'D' of the amorphous silicon particles is defined.

In other meaning, the crystal structure is varied depending on molecular formulas of the source gas used, and the size of the community region determined by the crystal structure is also varied, so that the size of the community region 'D' including one metal particle is varied.

According to the property of the chemical adsorption, the present invention includes the step of forming the community region. The community region is uniformly distributed such that its concentration at a low concentration region is adjustable, thus capable of forming the community region per one metal particle having a uniform distribution.

Meanwhile, the related art ALD process cannot be expected to sufficiently obtain a high density thin film due to the self-limited mechanism and the metal molecule. To supplement this, a plurality of layers are overlapped with one another. However, the present invention converts the above drawbacks into advantages by adjusting the community region in accordance with the concentration of the community region.

A source gas, a flow thereof, and a composition temperature for forming this community region are experimentally determined. This chemical adsorption uses a metal compound gas instead of a metal panel, which is a target, as in the above-descried sputtering, and a magnetic field does not need to be formed, so that the present invention can be readily applicable to a large-sized glass substrate.

Next, to remove radicals other than nickel chemically adsorbed together with amorphous silicon from a nickel molecule, that is, to form a metal layer on amorphous silicon, thermal decomposition temperature is prepared or a reaction gas is introduced into a process space at temperature less than thermal decomposition temperature.

For example, the reaction gas is one of a reduction gas, such as $H_2$ and $NH_3$, an inert gas, such as Ar and $N_2$, an oxidation gas, such as $O_2$ and $N_2O$, and a gas excited as plasma. This reaction gas reacts with CP, so that a metal core is left in the community region of the amorphous silicon, and $_mC_nH_{2n+2}$, which is a by-product, is generated and purged and thus removed.

That is, one nickel is disposed in one community region D of amorphous silicon through reaction of $Nicp2+H_2 \rightarrow Ni+ _mC_nH_{2n+2}$, so that a set of community regions constitutes a nickel metal layer.

The by-product is exhausted to the outside of the process space by a purge gas, and finally one nickel is disposed in a community region having a uniform distribution and whose area is adjustable, so that a nickel layer is formed at a low concentration metal core distribution on the amorphous silicon layer.

During the removal or suppression of this radical, the nickel core is arbitrarily extracted from nickel core distribution to the community region to suppress the nickel core so as to obtain extremely low concentration metal core distribution, so that nickel core distribution density is reduced and metal core arrangement density having extremely low concentration of a minimum degree is achieved. A size control of a grain is performed on the basis of the achieved metal core arrangement density having extremely low concentration of a minimum degree.

That is, thermal decomposition of a source gas, a Ni—Si bonding, and the community region formed to the silicon layer by corresponding self-restriction are arranged as probability distribution.

In this probability distribution, other community region excluding a Ni—Si bonding is extracted (or metal silicide core is suppressed), so that an arrangement density of Ni, which is a metal core, is minimized.

Therefore, present invention includes forming an ambient for removing a metal core from a metal core distribution region where community regions each having one metal core are adjacent, and arbitrarily separating the adsorbed metal core from the amorphous silicon layer.

Here, an oxygen ambient is formed in a process space, and heat treatment is performed at a predetermined temperature, so that adsorbed metal core is oxidized to suppress forming of a metal silicide core.

That is, during the forming of the metal silicon core, oxygen reacts with nickel to form a nickel oxide, which cannot participate in the forming of the silicide.

At this point, one of gases $O_2$, $H_2O$, $N_2O$, and $O_3$ is introduced into the process space in order to form an oxygen ambient in the process space.

Also, the gas in a plasma state is introduced to assist oxidation of metal core.

Through the above process, distribution density of nickel atoms contained in the amorphous silicon layer is reduced, and consequently a size of a grain is extended, and the suppression of the nickel silicide core using the arbitrary separating of the metal core has uniform distribution in terms of probability.

The suppression of the forming of the nickel silicide core is determined by combining with an entire process, which will be described in more detail with reference to FIG. 5. FIG. 5A illustrates heat treatment for metal-induced lateral crystallization (MILC) is performed with a community region formed by atomic layer deposition (ALD) and a polycrystalline silicon thin layer is formed.

At this point, heat treatment using an oxygen ambient is not performed, and instead crystallization heat treatment is performed at 600° C. for one hour under a nitrogen ambient. Through this process, a polycrystalline silicon thin layer is formed in a state of a densest community region.

Next, FIG. 5B illustrates a surface of a polycrystalline silicon thin layer after heat treatment is performed at 300° C. for thirty minutes under an oxygen ambient and heat treatment is performed at 600° C. for one hour under a nitrogen ambient. Through this process, a gain having an average diameter of about 4.5 μm is obtained.

At this point, process separation is considered. For example, a metal core suppression process and a heat treatment process for a metal induction process are separately applied.

Temperature at which heat treatment using oxygen starts to have an effect is more than 250° C., and deposition using self-restriction of ALD can be performed at a temperature below 186° C., which is thermal decomposition temperature of NiCp2. Therefore, the temperature for the heat treatment using oxygen and the temperature for the deposition has a difference of about 100° C.

In addition, since the crystallization temperature is 500° C. or higher, it is 300° C. higher than the deposition temperature. Therefore, if the apparatus is constructed such that the deposition process and the crystallization process are performed in-situ, it is advantageous that the apparatus is simple and its cost is low. However, it takes a predetermined time in elevating or lowering the temperature and thus, the apparatus may be constructed such that the metal nucleus deposition process, the metal nucleus suppression process, and the crystallization process are performed separately in consideration of productivity.

Thereafter, FIG. 5C illustrates the surface of the polysilicon thin film which has undergone the crystallization process at 600° C. for 1 hour in oxygen ambient. Through this crystallization process, there is formed a grain of which a diameter is about 20 μm on the average.

This result is achieved by gradually increasing the temperature up to 600° C. in an hour after depositing the metal nucleus. The present invention is embodied such that the boundary range between the temperature range for the metal nucleus suppression process and the temperature range for the crystallization should be continued.

In conclusion, for the heat treatment for performing the MILC, the reaction chamber should be heated at the crystallization temperature. While heating up the reaction chamber, the temperature range for the metal nucleus suppression is incorporated in the heating temperature. Accordingly, the suppression of the metal nucleus is naturally performed because of the corresponding temperature during the heating temperature and the corresponding exposure time.

Whether the process is performed in separate process or continuous process manner, it is confirmed from the above experimental results that there exists a correlation between the exposure time of the heat treatment in oxygen ambient and the suppression of the metal nucleus. According to the present invention, it is possible to selectively perform the control of the grain size. In this case, there are many combinations to control the grain size desirably.

That is, the disposition density of the metal nucleus becomes minimum through the distribution of the metal nucleus of the first layer using the surface reaction of the ALD, and the disposition of the metal nucleus by extracting the metal nucleus from the first layer.

At this time, it is possible to control the suppression condition of the metal silicide reaction by means of the oxidation of the metal nucleus at random through the control of the thermal oxidation condition, which may be controlled according to the concentration of the oxygen ambient, the temperature and time.

The nickel layer, which is sufficient by performing the ALD process in one cycle, is formed to a thickness smaller than an atomic layer.

Herein, the meaning the metal layer is formed to the thickness smaller than the atomic layer is that the average thickness of the metal layer is smaller than that of the atomic layer because the metal atoms are disposed to have low concentration.

In addition, the distribution density of the metal nucleus may be increased by means of the metal nucleus distribution of the second layer and the extraction of the metal nucleus. According to the circumstances, the process of extracting the metal nucleus may be omitted.

After all, it is possible to secure the grain with appropriate size, which the channel region requires, by the metal nucleus distribution for securing the minimum density, and the repetition process added thereto.

Furthermore, as illustrated in FIG. 6, after excess is removed through the removal process of the excess gas, and then the adsorbed metal compound is thermally decomposed or the amorphous silicon is reacted with the radical except the adsorbed metal nucleus by supplying reaction gas, the present invention further includes a process of controlling the distribution density of the metal nucleus by releasing the community region where the metal compound constitutes using the purge gas and by re-adsorbing the metal compound among preoccupied metal nuclei.

It is possible to control the grain size by controlling the disposition density of the metal nucleus. In particular, the metal nuclei with the extremely low concentration may be disposed through the control of the disposition density of the metal nucleus in combination with the process of controlling the disposition density of the metal nucleus in the process of controlling the distribution density. On the basis of this, it is possible to obtain the desired distribution density of the metal nucleus by controlling the distribution density again.

Accordingly, the present invention further includes a process of controlling the distribution density of the metal nucleus by releasing the community region where NiCp constitutes using the purge gas and by re-adsorbing NiCp among preoccupied Ni nuclei, after excess gas is removed in the removal process of the excess gas, and then NiCp is thermally decomposed or the amorphous silicon is reacted with the radical except the adsorbed Ni nucleus by supplying reaction gas.

For instance, the community region where NiCp constitutes, which is formed by one-cycle process, is released and only the nickel nucleus is combined with the silicon. Under this state, the space between the nickel nuclei is provided as the region where other NiCp preoccupies.

If a two-cycle process of the ALD process is performed additionally, NiCp is adsorbed between the nickel nuclei, which forms another community region preoccupied. Therefore, the distribution density of the metal nuclei is increased.

FIG. 7 is a lateral concept view illustrating another embodiment of the present invention. In FIG. 7, the metal nucleus is fixed between amorphous silicon layers by disposing the metal nucleus on half of the amorphous silicon layer, and subsequently forming the other half of the amorphous silicon layer.

Since the metal nuclei are disposed physically in the inside of the amorphous silicon layer, physical separation of the adsorbed metal nuclei is prevented from occurring. As the whole amorphous silicon layer is crystallized with the metal nuclei disposed in the middle thereof and acting as a catalyst, the speed and the uniformity may be further improved.

In the present invention, the metal nuclei are obtained through the forming of the metal nucleus distribution region, and the purging of the excess gas and removing of the radicals described in one embodiment, and in this state, the half of the amorphous silicon layer is formed thereon.

Nickel nuclei are uniformly formed in a distribution region on the amorphous silicon through the aforementioned embodiments, and a thermal treatment process for crystallization is performed in a state where an excess gas is sufficiently purged and removed.

During the thermal treatment, NiCp is thermally decomposed. Therefore, purging and removing Cp may be further included.

In the same context described above, since the present invention employs a CVD device included in conditions thereof, a thermal treatment process for the crystallization may be performed in the same process space.

That is, a heating unit that provides a deposition environment is necessary for the CVD, and thus the thermal treatment process for the crystallization may also be performed in the same process space.

Such a thermal treatment unit may not be used together with a related art sputtering device, but process conditions of the present invention allow the common use of the thermal treatment unit.

For this reason, the present invention is characterized in that, after the removing of the excess gas, the polycrystallinelization including the thermal treatment for the crystallization may be further performed in a reaction chamber, which is the same process space.

Applicable to exemplary views of FIGS. 2A and 2B, the reaction chamber providing a process space according to the present invention includes a source gas supply unit 10 supplying gaseous metal compounds (e.g., Ni(Cp)$_2$ gas) for adsorbing of metal nuclei, and a gas exhaust unit 14 for exhausting an excess gas. Also, a heating unit 16 is mounted in the reaction chamber to provide a thermal-decomposition temperature environment for the adsorbing of the metal nuclei, and a thermal-treatment environment for the crystallization. Thus, the reaction chamber 1 acts as a common reaction chamber for successive processes in which the metal nuclei are adsorbed onto a glass substrate and successively, the thermal treatment for the crystallization is performed by the source gas supply and exhaust units for forming the metal nuclei, and the heating unit 16 for the common use.

The heating unit 16 in the reaction chamber may be used in common for both a rapid thermal process (RTP) and an atomic layer deposition (ALD).

The present invention may be implemented by a combination of separated process spaces. As described in the exemplary view of FIG. 2C, a plurality of reaction chambers for the crystallization process, and one reaction chamber for the distribution process are combined together.

This combination of the reaction chambers is made to reduce the overall process time when the RTP is not performed and the thermal treatment process consumes more time as compared to the metal catalyst distribution process.

To this end, in the apparatus for manufacturing a polycrystalline silicon thin film according to the present invention, the reaction chamber 1 for the distribution process includes a source gas supply unit 12 supplying gaseous metal compounds for adsorbing of metal nuclei, a gas exhaust unit 14 for exhausting an excess gas, and a heating unit 16 for adsorbing.

Also, reaction chambers 18 for the crystallization process including a heating unit 16 for the crystallization are installed as the plurality of reaction chambers different from the reaction chamber 1 for the distribution process.

Also, the plurality of reaction chambers 18 for the crystallization process are connected to the reaction chamber 1 for the distribution process via a loadlock chamber 20 including an end effector 22 performing loading/unloading for the thermal treatment of the glass substrate 100 processed in the reaction chamber 1 for the distribution process.

As described above, according to the present invention, a metal layer which maintains a proper distribution of metal particles for forming a crystallization nucleus in an amorphous silicon layer is formed, thus decreasing a contamination due to the metal particles in the MILC.

Especially, the metal particles for forming the crystallization nuclei in the amorphous silicon layer are distributed with a proper density at an extremely low concentration, thus capable of adjusting the grain size.

Also, the metal layer is formed by a chemical adsorption, thus making it possible to perform a large-sized deposition, a fine adjustment of the film thickness, and a uniform deposition of metal/metal compound having an atomic layer thickness, which is impossible by the general CVD.

In addition, the deposition process of the amorphous silicon layer, the distribution process of the metal nucleus and the heat treatment process for crystallization can be successively performed in one apparatus, thus decreasing the process time and enhancing the productivity.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for forming a polycrystalline silicon thin film by including depositing an amorphous silicon layer on a glass substrate and forming a metal layer on the amorphous silicon layer to crystallize the amorphous silicon layer, the method comprising:

a metal nucleus adsorbing step of introducing a vapor phase metal compound into a process space where the glass substrate having the amorphous silicon formed thereon is disposed, to adsorb a metal nucleus contained in the metal compound into the amorphous silicon layer;

a metal nucleus distribution region-forming step of forming a community region including a plurality of silicon particles every metal nucleus in a plane boundary region occupied by the metal compound by a self-limited mechanism due to the adsorption of the metal nucleus; and an excess gas-removing step of purging and removing an excess gas which is not adsorbed in the metal nucleus distribution region-forming step.

2. The method according to claim 1, after removing the excess gas in the excess gas removing step, further comprising a metal nucleus disposition density adjusting step of thermally treating and oxidizing the metal nucleus in an oxygen ambient to randomly suppress a metal-silicide nucleus formation for a metal-induced crystallization and performing a metal-induced crystallization process.

3. The method according to claim 2, wherein the oxygen ambient of the metal nucleus disposition density adjusting step is formed by introducing $O_2$ gas, $H_2O$ gas, $N_2O$ gas or $O_3$ gas into the process space.

4. The method according to claim 2, wherein the oxygen ambient is formed by introducing oxygen compound into the process space in a plasma state.

5. The method according to claim 2, wherein the thermal treatment in the metal nucleus disposition density adjusting step is performed in a temperature range of from a metal nucleus adsorbing process temperature to a crystallization heat treatment temperature.

6. The method according to claim 2, wherein the heat treatment in the metal nucleus disposition density adjusting step is included in a temperature elevation process for performing a metal-induced crystallization.

7. The method according to claim 2, wherein the metal nucleus disposition density adjusting step further comprises a grain size adjusting step of adjusting the grain size depending on the temperature of the heat treatment and an exposure time.

8. The method according to claim 1, after removing the excess gas in the excess gas removing step, further comprising a distribution density adjusting step of reacting the amorphous silicon layer with radicals other than the adsorbed metal nucleus by a thermal decomposition or by introducing a reaction gas, purging and removing the remaining radicals to release the community region, again adsorbing the metal compound between the occupied metal nuclei to adjust the distribution density of the metal nuclei.

9. The method according to claim 1, after removing the excess gas in the excess gas removing step, further comprising a polycrystallinelization processing step of performing a thermal treatment for a crystallization in a reaction chamber that is the same process space.

10. The method according to claim 1, wherein a metal constituting the vapor phase metal compound is any one selected from the group consisting of Ni, Al, Ti, Ag, Au, Co, Sb, Pd, Cu, or a combination thereof.

11. The method according to claim 1, wherein the metal nucleus distribution region-forming step is performed using an ALD (atomic layer deposition).

12. The method according to claim 11, wherein after the metal nucleus distribution region-forming step, the excess gas removing step comprises reacting the amorphous silicon layer with radicals other than the adsorbed metal nucleus by a thermal decomposition or by introducing a reaction gas, and purging and removing the remaining radicals such that the metal nuclei are distributed at a single atomic layer thickness or less by the ALD of one cycle.

13. The method according to claim 1, wherein the metal nucleus adsorbing-step is performed in a temperature environment having a temperature range of 100-300° C.

14. The method according to claim 1, wherein the vapor phase metal compound is supplied with a pressure of 0.1 Torr to 300 Torr.

15. The method according to claim 1, after removing the excess gas in the excess gas removing step, further comprising:
- a metal nucleus disposing step of reacting the amorphous silicon layer with radicals other than the adsorbed metal nucleus by a thermal decomposition or by introducing a reaction gas, and purging and removing the remaining radicals to dispose only the metal nucleus; and
- a metal catalyst-containing amorphous silicon layer-forming step of forming an amorphous silicon layer having a remainder thickness on a distribution of the metal nuclei disposed on the amorphous silicon layer formed at a predetermined thickness in the metal nucleus-disposing step.

16. In an apparatus for forming a polycrystalline silicon thin film including an amorphous silicon deposition apparatus having a first reaction chamber that is a process space, for depositing an amorphous silicon layer on a glass substrate is installed, and a metal nucleus deposition apparatus having a second reaction chamber that is a separate process space from the deposition apparatus, for depositing a metal nucleus on the glass substrate having the amorphous silicon layer formed thereon, the apparatus for forming a polycrystalline silicon thin film comprising:
- a source gas supply unit (10) for supplying a vapor phase metal compound for an adsorption of a metal nucleus into a reaction chamber providing a process space, together with a deposition gas supplying unit (12) for deposition of an amorphous silicon layer;
- a gas exhaust unit (14) for exhausting the reacted deposition gas and an excess gas; and
- a heating unit (16) disposed in the reaction chamber (1) to provide the reaction chamber with a thermal decomposition temperature environment for the deposition of the amorphous silicon layer and a thermal treatment environment for adsorption of the metal nucleus,
- wherein the reaction chamber (1) is included in the apparatus for forming a polycrystalline silicon thin film, as an in-situ process reaction chamber for performing a step of depositing the amorphous silicon layer and a step of adsorbing the metal nucleus in a same process space in-situ using the source gas supply unit (10), the gas exhaust unit (14) and the heating unit (16).

17. In an apparatus for forming a polycrystalline silicon thin film including a metal nucleus deposition apparatus having a first reaction chamber that is a process space, for depositing a metal nucleus on a glass substrate having an amorphous silicon layer formed thereon, and a crystallization process apparatus having a second reaction chamber that is a separate process space from the metal nucleus deposition apparatus, for thermally treating the glass substrate with the metal nucleus to perform a crystallization of the amorphous silicon layer, the apparatus for forming a polycrystalline silicon thin film comprising:
- a source gas supply unit (10) for supplying a vapor phase metal compound for an adsorption of a metal nucleus into a reaction chamber providing a process space;
- a gas exhaust unit (14) for exhausting an excess gas; and
- a heating unit (16) disposed in the reaction chamber (1) to provide the reaction chamber with a thermal decomposition temperature environment for the adsorption of the metal nucleus and a thermal treatment environment for crystallization of the amorphous silicon layer,
- wherein the reaction chamber (1) is included in the apparatus for forming a polycrystalline silicon thin film, as an in-situ process reaction chamber for performing a step of adsorbing the metal nucleus on the glass substrate and a thermal treatment step in a same process space in-situ using the source gas supply unit (10), the gas exhaust unit (14) and the heating unit (16).

18. In an apparatus for forming a polycrystalline silicon thin film including a metal nucleus deposition apparatus having a first reaction chamber that is a process space, for depositing a metal nucleus on a glass substrate having an amorphous silicon layer formed thereon, and a crystallization process apparatus having a second reaction chamber that is a separate process space from the metal nucleus deposition apparatus, for thermally treating the glass substrate with the metal nucleus to perform a crystallization of the amorphous silicon layer, the apparatus for forming a polycrystalline silicon thin film comprising:
- a source gas supply unit (10) for supplying a vapor phase metal compound for an adsorption of a metal nucleus into a distribution process reaction chamber providing a process space;
- a gas exhaust unit (14) for exhausting an excess gas;
- a heating unit (16) provided for an adsorption of a metal nucleus;
- a crystallization process reaction chamber (18) separately disposed from the distribution process reaction chamber (1) and provided with the heating unit (16);
- wherein the crystallization process reaction chamber (18) is connected with the distribution process reaction chamber through a loadlock room (20) having an end effector (22) for loading/unloading the glass substrate such that the glass substrate (100) transferred from the distribution process reaction chamber (1) is thermally treated.

* * * * *